(12) United States Patent
Hirota et al.

(10) Patent No.: US 6,805,135 B1
(45) Date of Patent: Oct. 19, 2004

(54) CLEANING FLUID AND CLEANING METHOD FOR COMPONENT OF SEMICONDUCTOR-TREATING APPARATUS

(75) Inventors: Kenichi Hirota, Fujisawa (JP); Hitoshi Yamada, Yokosuka (JP); Kiyoshi Yuasa, Fujisawa (JP); Eiji Yamaguchi, Kitakoma-gun (JP); Shinichi Kawaguchi, Kofu (JP); Takahiro Shimoda, Kofu (JP); Nobuyuki Nagayama, Nirasaki (JP)

(73) Assignees: Nittou Chemical Industries, Ltd., Tokyo (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/700,704

(22) PCT Filed: May 25, 1999

(86) PCT No.: PCT/JP99/02745

§ 371 (c)(1),
(2), (4) Date: Nov. 24, 2000

(87) PCT Pub. No.: WO99/61573

PCT Pub. Date: Dec. 2, 1999

(30) Foreign Application Priority Data

May 26, 1998 (JP) .......................................... 10-183230

(51) Int. Cl.$^7$ ................................................. C32G 1/00
(52) U.S. Cl. ........................ 132/2; 134/22.1; 134/22.19; 134/32; 134/40; 510/201; 510/202; 510/203; 510/206; 510/245; 510/254; 510/356; 510/365; 510/405; 510/433; 438/905

(58) Field of Search ........................ 134/2, 22.1, 22.19, 134/32, 39, 40, 26, 28, 30, 37, 42; 510/201, 202, 203, 206, 245, 254, 356, 365, 405, 433, 363, 238; 438/905

(56) References Cited

U.S. PATENT DOCUMENTS

| 4,156,619 A | * | 5/1979 | Griesshammer ............... 134/2 |
| 4,664,721 A | | 5/1987 | Valasek |
| 5,102,573 A | * | 4/1992 | Han et al. ..................... 134/19 |
| 5,456,760 A | * | 10/1995 | Goehausen .................. 134/42 |
| 5,573,710 A | * | 11/1996 | McDonell .................... 510/221 |
| 6,090,765 A | * | 7/2000 | Black et al. .................. 134/26 |

FOREIGN PATENT DOCUMENTS

| DE | 42 28 461 | | 1/1994 |
| EP | 0081355 | * | 6/1983 |
| EP | 0 678 571 | | 10/1995 |
| JP | 7-173492 | | 7/1995 |
| JP | 10-239866 | | 9/1998 |
| WO | WO 97/12947 | | 4/1997 |

* cited by examiner

*Primary Examiner*—Michael Kornakov
(74) *Attorney, Agent, or Firm*—Oblon, Spivak, McClelland, Maier & Neustadt, P.C.

(57) ABSTRACT

A cleaning solution is used to remove a byproduct derived from a decomposed substance of a process gas containing C and F. The cleaning solution contains 75 wt % N-methyl-2-pyrrolidone, 15 wt % ethylene glycol monobutyl ether, 0.5 wt % surfactant, and 9.5 wt % water. The content of an alkali metal in the cleaning solution is set to be less than 10 ppb.

17 Claims, 1 Drawing Sheet

CLEANING FLUID AND CLEANING METHOD FOR COMPONENT OF SEMICONDUCTOR-TREATING APPARATUS

TECHNICAL FIELD

The present invention relates to a cleaning solution and a cleaning method for a component of a semiconductor processing apparatus. More specifically, the present invention relates to a cleaning solution and a cleaning method for removing a byproduct deposited on a component of a semiconductor processing apparatus and derived from the decomposed substances of a process gas containing C and F. Semiconductor processing here means a variety of processes executed to manufacture semiconductor devices on target substrates, such as semiconductor wafers or LCD substrates, and structures including interconnections and electrodes connected to semiconductor devices by forming semiconductor layers, insulating layers, conductive layers, and the like in predetermined patterns on the target substrates.

BACKGROUND ART

Etching is one of the main semiconductor processes. Etching is performed using an etching apparatus having a process chamber in which an upper electrode is arranged to oppose a lower electrode (susceptor). To etch a silicon oxide ($SiO_2$) film on the surface of a semiconductor wafer in this etching apparatus, a wafer serving as the target substrate is placed on the lower electrode. In this state, RF power is supplied to the lower electrode while a fluorocarbon-based (including a hydrofluorocarbons-based) process gas, i.e., CF-based process gas, such as $CF_4$, is introduced into a process chamber. With this operation, the process gas is converted into a plasma, and the silicon oxide film is anisotropically etched by this plasma.

In this etching, characteristics, such as etching anisotropy and etching rate, are controlled using the CF-based deposit produced from the decomposed substances of the process gas. More specifically, the chemical and physical actions given to the silicon oxide film from the active species and ions from the plasma are controlled by the CF-based deposit on a portion to be etched, e.g., the inner surface of a contact hole. That is, CF-based products are essential in the etching process, and CF-based byproducts also deposit on various components in the process chamber.

For example, some etching apparatus of this type includes a clamp ring for fixing a target substrate, e.g., a semiconductor wafer, on a lower electrode and a focus ring for causing a plasma produced in the process chamber to impinge on the wafer in a desired state. A baffle plate is disposed around the lower electrode to adjust the conductance in the process chamber. A wall protecting member is disposed along the side wall in order to protect the inner surface of the process chamber. The above-mentioned CF-based byproducts cumulatively deposit on all these components.

A deposit made of a CF-based byproduct peels off when it reaches a certain thickness, thereby producing particles. This degrades the yield of semiconductor devices. For this reason, before the deposit peels off, these components must be cleaned to remove the deposit. To reduce the downtime of the apparatus, components on which a CF-based byproduct readily deposits are generally built from components that are easy to exchange. Components with a CF-based byproduct deposited thereon, after use for a predetermined period of time, are removed from the process chambers, and new cleaned equivalent components are attached to the corresponding positions.

Conventionally, components with a deposit of a CF-based byproduct attached thereto are removed and dipped in a fluorine-based solvent (e.g., perfluorocarbon: PFC) or acetone in order to swell the deposit. Then, to peel the deposit off, the components are ultrasonically vibrated in pure water and thus cleaned.

In the above cleaning, since the CF-based byproduct is removed by swelling and peeling the deposit, a very large number of fine CF-based byproduct particles remain on the components on the microscopic level even after they are cleaned. The fine CF-based byproduct particles are peeled off by RF discharge and deposit on the wafer in the form of particles.

In etching of this type, so-called seasoning for processing a number of dummy wafers (20 to 25 dummy wafers) is generally performed after the cleaned components are mounted in the process chamber. This seasoning amounts to coating the fine residue remaining on the components with a new CF-based byproduct, thereby suppressing generation of particles below a prescribed value. The time (1 to 2 hours) for processing the dummy wafers substantially accounts for downtime of the apparatus.

The use of PFC or acetone requires several days to clean the components with the deposit made of a CF-based deposit attached thereto. This results in very low work efficiency. In addition, PFC has a global warming coefficient much larger than $CO_2$, although PFC is chemically stable and easy to handle. Acetone is a material toxic to man and having a low flash point. Acetone therefore requires sophisticated settings for use environment and much cost in storage and management.

DISCLOSURE OF INVENTION

The present invention has been made in consideration of the conventional problems described above, and an object thereof is to provide a cleaning solution and a cleaning method for a component of a semiconductor processing apparatus, in which a CF-based byproduct can be efficiently and reliably removed.

Another object of the present invention is to provide a cleaning solution and a cleaning method for a component of a semiconductor processing apparatus, which are highly safe and hardly cause destruction of terrestrial environment.

According to the first aspect of the present invention, there is provided a cleaning solution for removing a byproduct derived from a decomposed substance of a process gas containing C and F, and deposited on a component in a process chamber of a semiconductor processing apparatus for subjecting a target substrate to a semiconductor process with the process gas, the cleaning solution containing N-methyl-2-pyrrolidone, ethylene glycol monobutyl ether, and a surfactant.

According to the second aspect of the present invention, in the cleaning solution of the first aspect, an alkali metal content is less than 10 ppb.

According to the third aspect of the present invention, the cleaning solution of the first or second aspect further contains water.

According to the fourth aspect of the present invention, in the cleaning solution of the third aspect, the water is contained at a content of 5 to 20 wt %.

According to the fifth aspect of the present invention, in the cleaning solution according to any one of the first to fourth aspects, the surfactant is contained at a content of 0.1 to 1.0 wt %.

According to the sixth aspect of the present invention, in the cleaning solution according to the fifth aspect, the surfactant contains fluorine.

According to the seventh aspect of the present invention, in the cleaning solution according to any one of the first to sixth aspects, a total content of the N-methyl-2-pyrrolidone and ethylene glycol monobutyl ether is 80 to 90 wt %, and a ratio of a content of the N-methyl-2-pyrrolidone to the total content of the N-methyl-2-pyrrolidone and ethylene glycol monobutyl ether is 0.75 to 0.95.

According to the eighth aspect of the present invention, there is provided a cleaning method for removing a byproduct derived from a decomposed substance of a process gas containing C and F, and deposited on a component in a process chamber of a semiconductor processing apparatus for subjecting a target substrate to a semiconductor process with the process gas, the method comprising the steps of: removing the component from the process chamber; and dipping the component in a bath of the cleaning solution according to any one of the first to seventh aspects.

According to the ninth aspect of the present invention, in the cleaning method according to the eighth aspect, the component is dipped in the bath of the cleaning solution while the component is stored in a cage with 500 to 100 meshes.

According to 10th aspect of the present invention, in the cleaning method according to the eighth or ninth aspect, the component is dipped in the bath of the cleaning solution while a temperature of the cleaning solution is set at 50 to 80° C.

According to the 11th aspect of the present invention, in the cleaning method according to any one of the eighth to 10th aspects, the semiconductor process comprises etching a layer consisting essentially of a silicon oxide on the target substrate by using the process gas.

BEST MODE FOR CARRYING OUT THE INVENTION

Figure 1:
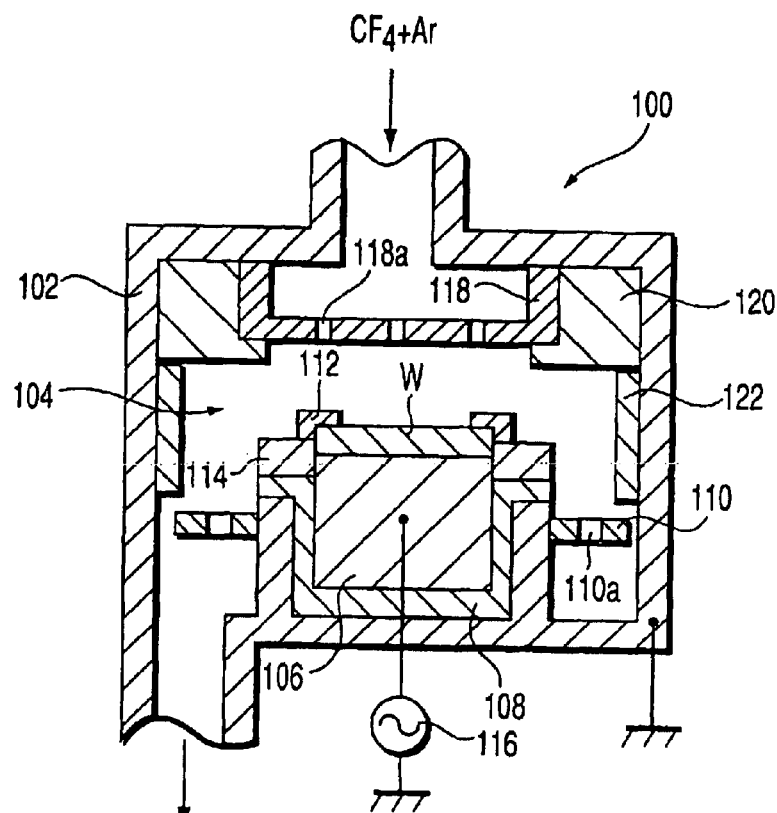
FIG. 1 is a sectional view showing a semiconductor processing apparatus according to an embodiment of the present invention.

The present inventors made extensive studies by many experiments about optimal cleaning agents for removing CF-based (e.g., fluorocarbon-based) deposits on a component of a semiconductor processing apparatus in the process of developing the present invention. As a result, the present inventors obtained the following findings.

A CF-based byproduct produced in an apparatus for etching a silicon oxide film with a CF-based gas is assumed to have a molecular structure almost the same as that of a fluorocarbon resin. The fluorocarbon resin is supposed to be very stable in highland low temperatures, chemically inactive, and not to be changed by a solvent, such as alcohol, ketone, or ester.

However, in some experiment, a component with a CF-based byproduct deposited thereon, after it was used in a process chamber of an etching apparatus of this type, was cleaned with a solution mixture (mainly containing N-methyl-2-pyrrolidone (to be also referred to as NMP hereinafter)) of NMP and ethylene glycol monobutyl ether (also called 2-butoxyethanol or butyl cellosolve), and it was found that the CF-based byproduct on the component was dissolved. N-methyl-2-pyrrolidone and ethylene glycol monobutyl ether are known well as solvents which dissolve a variety of synthetic resin materials well and are used in a variety of fields. These solvents are also known well as solvents which do not dissolve fluorocarbon resins.

Since the CF-based byproduct produced in the etching apparatus of this type is similar to fluorocarbon resins, as described above, the above phenomenon seemed to be contradictory to this knowledge. To confirm whether this dissolving phenomenon can be generalized, experiments were made on CF-based byproducts produced under various conditions in an etching apparatus of this type. As a result, it was confirmed that all the CF-based byproducts were dissolved in a solution mixture of NMP and 2-butoxyethanol at a given mixing ratio. Also, when a fluorocarbon resin component with the CF-based byproduct deposited thereon was dipped in a solution mixture of NMP and 2-butoxyethanol, only the CF-based byproduct was properly dissolved and removed, and the fluorocarbon resin component was substantially not damaged.

A mechanism for allowing the CF-based byproduct, which is assumed to have a molecular structure almost the same as that of fluorocarbon resins, to dissolve in the solution mixture of NMP and 2-butoxyethanol is not clear. One possible reason is that a CF-based layer deposited as the byproduct has a molecular structure considerably different from an ideal state. In any case, the studies of the present inventors open a new path, which has never been opened by the conventional knowledge, for a cleaning solution for removing a CF-based byproduct deposited on a component of a semiconductor processing apparatus.

According to the present invention, a cleaning solution is prepared on the basis of the above findings, and is used for removing a byproduct derived from a decomposed substance of a process gas containing C and F, and deposited on the component in a process chamber of a semiconductor processing apparatus for subjecting a target substrate to a semiconductor process with the process gas. The cleaning solution contains N-methyl-2-pyrrolidone (i.e., NMP), ethylene glycol monobutyl ether (i.e., 2-butoxyethanol or butyl cellosolve), and a surfactant.

The content of an alkali metal in the cleaning solution is preferably set to be less than 10 ppb. This can prevent the alkali metal from attaching to the component of the semiconductor processing apparatus during cleaning and can also prevent a target substrate, such as a semiconductor wafer, from being contaminated when this component is used again in the process chamber.

The total content of NMP and 2-butoxyethanol in the cleaning solution is preferably set at 80 to 90 wt %. The weight ratio of the content of NMP to the total content of NMP and 2-butoxyethanol is preferably set at 0.75 to 0.95, more preferably to 0.8 to 0.9, and still more preferably 0.82 to 0.86. The CF-based byproducts were properly dissolved in these ranges in experiments in which the composition of the cleaning solution was variously changed, mainly using the mixing ratio of NMP and 2-butoxyethanol. Experiments were also conducted when the cleaning solution did not contain NMP or 2-butoxyethanol, and resulted in that the solubility of the CF-based byproduct was low, as compared with a solution mixture of NMP and 2-butoxyethanol.

The surfactant serves to reduce the surface tension of a cleaning solution and make the cleaning solution readily permeate into the contaminant. A surfactant for minimizing the surface tension of NMP and 2-butoxyethanol is preferably used. In this respect, the surface tensions of NMP added with a silicon-containing surfactant SS and NMP added with a fluorine-containing surfactant SF were measured.

Figure 2:
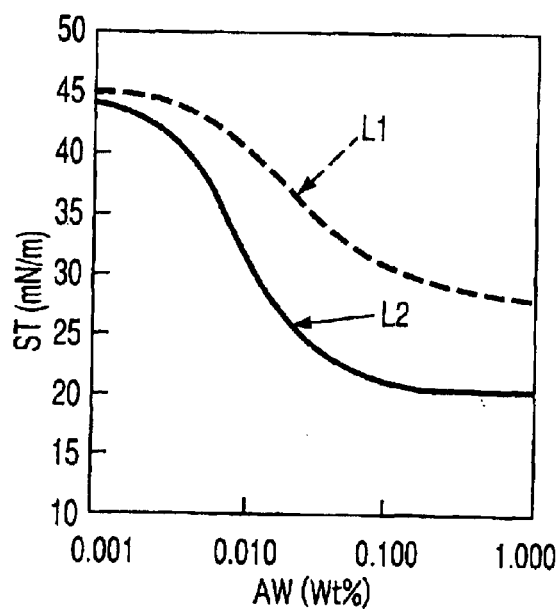
FIG. 2 is a graph showing the experimental results about the surface tension of a cleaning solution according to the present invention.

FIG. 2 is a graph showing the experimental results about the surface tensions. In FIG. 2, a content AW of each surfactant is plotted along the abscissa while the surface tension ST is plotted along the ordinate. A broken line L1 represents a case wherein the silicon-containing surfactant is added, while a solid line L2 represents a case wherein the fluorine-containing surfactant is added. As shown in FIG. 2, according to the experiment, obviously, the surfactant to be added to the cleaning solution preferably contains fluorine, from the viewpoint of reducing the surface tension of the cleaning solution.

The content of the surfactant in the cleaning solution is preferably set at 0.1 to 1.0 wt %. As shown in FIG. 2, when the content of the surfactant is 0.1 wt % or more, the effect of reducing the surface tension of the cleaning solution can be obtained, while the surface tension is not much reduced with an increase in the content. If the content of the surfactant exceeds 1 wt %, dot-like "stains" remain on a substrate after cleaning. Since the surfactant is expensive, its content is preferably as low as possible in order to also reduce the cost of the cleaning solution.

Preferably, the cleaning solution further contains water. In this case, the water content in the cleaning solution is preferably set at 5 to 20 wt %. Since NMP and 2-butoxyethanol have flash points, water added to the cleaning solution can eliminate the flash points. The cleaning solution can then be handled as a "nondangerous article" and facilitate storage and management. If the water content is less than 5 wt %, the cleaning solution still have a flash point. If the water content exceeds 20 wt %, the solubility of CF-based byproducts decreases.

Water in the cleaning solution also has an action of absorbing inorganic salts, such as an alkali metal, which serve as an impurity to the target substrate. Refined water from which inorganic salts are removed is preferably used as water. The refined water has a lower content of inorganic salts than pure water, as shown in Table 1 below.

TABLE 1

| Component | Al | Cr | Ni | Fe | Cu | K | Na |
|---|---|---|---|---|---|---|---|
| Refined Water | ND | ND | ND | ND | 1.49 | 0.66 | 0.56 |
| Pure Water | 2.15 | ND | ND | ND | 1.82 | 2.48 | 8.16 |

(Unit: ppb, ND: below lower detection limit)

A cleaning method for a component of a semiconductor processing apparatus using such a cleaning solution will now be described.

FIG. 1 is a sectional view showing an etching apparatus 100 having components to be cleaned with a cleaning solution according to the present invention.

A process chamber 102 of the etching apparatus 100 shown in FIG. 1 is made of a conductive metal, such as Al (aluminum), to form a process space 104 in the process chamber 102. A susceptor (lower electrode) 106 for supporting a semiconductor wafer W is disposed in the process chamber 102. The susceptor 106 is fixed in the process chamber 102 through an insulating member 108. A baffle plate 110 having a number of through holes 110a and grounded is attached around the susceptor 106. A plasma is confined in the process space 104 by the susceptor 106 and baffle plate 110. A clamp ring 112 is arranged to hold the peripheral edge of the wafer W placed on the susceptor 106. A focus ring 114 for focusing an electric field on the wafer W is disposed around the wafer W. An RF power supply 116 for outputting RF power is connected to the susceptor 106.

An upper electrode 118 serving as a counterelectrode to the susceptor 106 is arranged at a position in the process chamber 102 where it faces the support surface of the susceptor 106. The upper electrode 118 is fixed to the process chamber 102 by a peripheral ring 120 arranged around the upper electrode 118 and grounded through the process chamber 102. A number of gas discharge holes 118a connected to a gas supply source (not shown) are formed in the upper electrode 118. A process gas, e.g., a gas mixture of $CF_4$ and Ar is introduced into the process space 104 through the gas discharge holes 118a. The atmosphere in the process space 104 is evacuated through the through holes 110a of the baffle plate 110 and the gap between the baffle plate 110 and the inner wall surface of the process space 104. The inner side surface of the process chamber 102 is covered with a wall protecting member 122 in correspondence with the process space 104 in order to prevent the plasma from directly contacting the side wall of the process chamber 102.

The baffle plate 110, clamp ring 112, focus ring 114, peripheral ring 120, wall protecting member 122 are made of a ceramic, Al whose surface is covered with $Al_2O_3$, $Al_2O_3$, fluorocarbon resin, polyimide, or Si in accordance with their application purposes. These members are detachable singly from the process chamber 102 and interchangeable with new equivalent components.

The etching apparatus 100 is typically used to etch a silicon oxide ($SiO_2$) film on the surface of the semiconductor wafer W.

In etching, the wafer W is placed on the susceptor 106 and fixed with the clamp ring 112. A gas mixture of $CF_4$ and Ar is introduced into the process space 104 through the gas discharge holes 118a. The process chamber 104 is evacuated and kept in a predetermined reduced pressure atmosphere. A predetermined RF power is then applied to the susceptor 106 to ionize the process gas introduced into the process space 104, thereby generating a plasma. The $SiO_2$ film on the wafer W is then etched using this plasma. When the etching is performed for a predetermined period of time, the wafer W is unloaded from the process chamber 102 and transferred to the next processing apparatus.

During etching, a reaction byproduct is produced in the process space 104 and attaches to a variety of components (members) arranged in the process space 104. More specifically, as in this embodiment, when the $SiO_2$ film on the wafer W is etched using the gas mixture of $CF_4$ and Ar, a CF-based byproduct attaches to the components, such as the baffle plate 110, clamp ring 112, focus ring 114, peripheral ring 120, and wall protecting member 122. The deposition amount of the CF-based byproduct on these components increases in proportion to the process time.

When thickness of the deposit made of the CF-based byproduct reaches a certain value, the deposit peels off to generate particles. These particles cause dielectric breakdown of semiconductor devices to reduce the yield of products. For this reason, before the deposit peels off, these components must be cleaned to remove the deposit. That is, components with the CF-based byproduct attached thereto upon use for a predetermined period of time are detached from the process chamber and replaced with new cleaned equivalent components.

Figure 3:
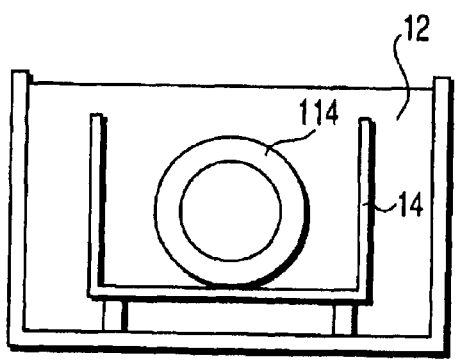
FIG. 3 is a view showing a state in which a component with a deposit made of a CF-based byproduct attached thereto is dipped in a cleaning solution.

After use for a predetermined period of time, components, such as the baffle plate 110, clamp ring 112, focus ring 114, peripheral ring 120, and wall protecting member 122, are replaced with new equivalent components. In this case, when a series of etching operations for the wafer W are complete and the final wafer W is unloaded from the process chamber 102, the interior of the process chamber r102 is replaced with an inactive gas, and components which are required to be replaced are removed from the process chamber 102. As shown in FIG. 3, these components are dipped in a bath 12 containing a cleaning solution having the above composition according to the present invention for a predetermined period of time, e.g., 7 hours to perform chemical cleaning. Note that the focus ring 114 is exemplified as a component with a deposit made of a CF-based byproduct attached thereto in FIG. 3.

In this case, the temperature of the cleaning solution is maintained in the range of 20° C. to 80° C. and preferably 50° C. to 80° C. As a result, the cleaning solution permeates into the CF-based byproduct attached to the component 114. The CF-based byproduct is dissolved at low speed while swelling, and thus the CF-based byproduct peels off from the component 114. Fine CF-based byproducts which tend to remain on the component in chemical cleaning can be dissolved with the cleaning solution.

In chemical cleaning, as shown in FIG. 3, the component 114 is dipped in the bath 12 of the cleaning solution while being kept in a cage 14 with 500 to 100 meshes. The CF-based byproduct peeled off from the component 114 is removed together when the component 114 is removed from the bath 12. This operation is required because the cleaning solution according to the present invention dissolves the CF-based byproduct while perfluorocarbon or acetone used as the conventional cleaning solution does not dissolve the CF-based byproduct. That is, when the CF-based byproduct peeled off from the component 114 stays in the bath 12 of the cleaning solution, the byproduct gradually dissolves in the bath 12 to change the composition of the cleaning solution. In this case, the bath 12 containing the cleaning solution must be frequently replaced with a new one.

The component 114 having undergone the chemical cleaning is dipped in refined water and washed with the water. With this operation, the contaminant attached to the component 114 during the chemical cleaning can be reliably removed. The component 114 is dried and then mounted in the process chamber 102 again when the corresponding component in the process chamber 102 is required for replacement.

A comparative experiment for cleaning components with a CF-based byproduct deposited thereon was conducted using an example of the above cleaning method and a comparative example of the conventional method. The component to be cleaned-was the one made of Al having the surface covered with $Al_2O_3$ and was used in the etching apparatus 100 shown in FIG. 1 for a predetermined period of time generally requiring periodical replacement.

In the example of the present invention, a cleaning solution had a composition consisting of 75 wt % NMP, 15 wt % 2-butoxyethanol, 0.5 wt % surfactant, and 9.5 wt % water, the temperature of the bath 12 containing the cleaning water was 50° C., and the dipping time of the component was 7 hours. In the comparative example of the conventional method, the cleaning solution was acetone, the temperature of the bath of the cleaning solution was 15° C., and the dipping time of the component was 5 hours.

Table 2 shows changes in the numbers of particles attached to wafers, when the component was processed by the example of the present invention and was mounted in the process chamber 102 for etching. Each wafer used was a 200-mm Si wafer, and the size of each detected particle was 0.2 $\mu$m or more. In general, when the size of detected particle is set at 0.2 $\mu$m or more for a 200-mm wafer, the wafer having 30 particles or less is regarded to satisfy the standard. That is, as shown in Table 2, according to the example of the present invention, when only one dummy wafer is processed, processing of an actual wafer can be started.

TABLE 2

| Wafer No. | 1 | 2 | 3 | 4 | 5 | 6 | 7 | 8 |
|---|---|---|---|---|---|---|---|---|
| No. of particles | 215 | 10 | 6 | 2 | 0 | 3 | 6 | 6 |

In contrast, according to the comparative example of the conventional method, the 20th wafer had 30 or less particles each having a size of 0.2 $\mu$m or more for the first time. That is, according to the comparative example of the conventional method, unless 20 or more dummy wafers are processed, processing of an actual wafer cannot be started. The processing of 20 dummy wafers takes 1 to 2 hours, which substantially accounts for downtime of the apparatus.

About 20 larger particles detected on the first wafer of the example of the present invention were analyzed by EDX (Energy Dispersible X-ray spectroscopy) in descending order of particle size. As a result, no CF-based particles were detected, and combinations of Al, O, and S accounted for most particles.

The cause of this can be thought as follows. That is, since a component used in the experiment is made of Al having the surface covered (anodized) with $Al_2O_3$, Al and O are present on the surface of the component. S is also present on the surface of the component because sulfuric acid is used in anodizing the component. Accordingly, Al, O, and S can be generated by friction when the component is mounted in the process chamber 102. These particles are weakly attached to the surface of the component, and most of the particles are detached from the surface of the component by initial RF discharge in etching. The particles are then exhausted outside the process chamber 102. Therefore, the number of detected particles is greatly reduced from the second wafer.

In contrast, in the comparative example of the conventional method, a fine CF-based byproduct probably is attached to and remains on the component. Since the CF-based byproduct is strongly attached to the surface of the component, it cannot be peeled off at once by the RF discharge in etching. Therefore, a larger number of dummy wafers have to be processed, that is, seasoning is required.

An experiment was conducted to check the relationship between the temperature of the cleaning solution according to the present invention and the solubility of the CF-based byproduct. In this experiment, the cleaning solution had a composition consisting of 75 wt % NMP, 15 wt % 2-butoxyethanol, 0.5 wt % surfactant, and 9.5 wt % water. A component with the CF-based byproduct deposited thereon was dipped in the cleaning solution for 3 hours.

Table 3 shows the results of measuring the solubilities of the CF-based byproduct at cleaning solution temperatures of 20° C., 50° C., and 70° C. As shown in Table 3, the higher the cleaning solution temperature, the higher the solubility.

The larger the thickness of the CF-based byproduct to be removed, preferably the higher the cleaning solution temperature. However, when the temperature of the cleaning solution excessively increases, water is evaporated and the cleaning solution components undesirably exhibit flash points. From this viewpoint, the temperature of the cleaning solution is preferably set at 50 to 80° C.

TABLE 3

| Temperature | Initial Weight (g) | Weight after Cleaning (g) | Solubility (%) |
|---|---|---|---|
| 20° C. | 2.00 | 1.99 | 0.5 |
| 50° C. | 2.00 | 1.77 | 11.5 |
| 70° C. | 2.00 | 1.67 | 16.5 |

As described above, the cleaning solution according to the present invention can more efficiently and reliably remove CF-based byproducts than the conventional cleaning solution. NMP (N-methyl-2-pyrrolidone) and 2-butoxyethanol (ethylene glycol monobutyl ether) are less toxic and rarely affect human health. Since NMP and 2-butoxyethanol readily decompose in outer air, use of these materials does not become one of the causes of global warming. Since NMP is inexpensive, use of this material does not increase the cleaning cost of the components of the semiconductor processing apparatus. Examples of the material of the component to be cleaned are ceramic, Al whose surface is covered with $Al_2O_3$, $Al_2O_3$, fluorocarbon resin, polyimide, and Si. Note that polyimide readily dissolves in the cleaning solution according to the present invention and a polyimide component must be cleaned within a short time. Semiconductor processing which generates CF-based byproducts is not only etching but also CVD.

The present invention has been described with reference to a preferred embodiment of the present invention in conjunction with the accompanying drawings. The present invention, however, is not limited to this. Various changes and modifications can be anticipated by those skilled in the art within the range of technical scope defined in the appended claims. These changes and modifications should be construed to be incorporated in the technical scope of the present invention.

What is claimed is:

1. A cleaning solution for removing a byproduct derived from a decomposed substance of a process gas containing C and F, and deposited on a component in a process chamber of a semiconductor processing apparatus for subjecting a target substrate to a semiconductor process with the process gas, the cleaning solution comprising N-methyl-2-pyrrolidone, ethylene glycol monobutyl ether, a surfactant, and water; and wherein the surfactant contains fluorine and a total content of the N-methyl-2-pyrrolidone and ethylene glycol monobutyl ether is 80 to 90 wt %, and a ratio of a content of the N-methyl-2-pyrrolidone to the total content of the N-methyl-2-pyrrolidone and ethylene glycol monobutyl ether is 0.75 to 0.95.

2. The cleaning solution according to claim 1, wherein the water concentration is 5 to 20 wt %.

3. The cleaning solution according to claim 1, wherein the surfactant concentration is 0.1 to 1.0 wt %.

4. The cleaning solution according to claim 1, wherein the composition comprises 10 ppb or less of an alkali metal.

5. A cleaning method for removing a byproduct derived from a decomposed substance of a process gas containing C and F, and deposited on a component in a process chamber of a semiconductor processing apparatus for subjecting a target substrate to a semiconductor process with the process gas, the method comprising:

removing the component from the process chamber; and dipping the component in a bath of a cleaning solution comprising N-methyl-2-pyrrolidone, ethylene glycol monobutyl ether, a surfactant, and water;

wherein, in the cleaning solution, a total content of the N-methyl-2-pyrrolidone and ethylene glycol monobutyl ether is 80 to 90 wt %, and a ratio of a content of the N-methyl-2-pyrrolidone to the total content of the N-methyl-2-pyrrolidone and ethylene glycol monobutyl ether is 0.75 to 0.95.

6. The cleaning method according to claim 5, wherein the component is dipped in the bath of the cleaning solution while the component is stored in a cage with 500 to 100 meshes.

7. The cleaning method according to claim 5, wherein the component is dipped in the bath of the cleaning solution while a temperature of the cleaning solution is set at 50 to 80° C.

8. The cleaning method according to claim 5, wherein the semiconductor process comprises etching a layer consisting essentially of a silicon oxide on the target substrate by using the process gas.

9. The cleaning method according to claim 5, wherein the cleaning solution further contains an alkali metal concentration of less than 10 ppb.

10. The cleaning method according to claim 5, wherein the water concentration is 5 to 20 wt %.

11. The cleaning method according to claim 5, wherein the surfactant concentration is 0.1 to 1.0 wt %.

12. The cleaning method according to claim 11, wherein the surfactant contains fluorine.

13. The cleaning method according to claim 5, wherein the surfactant contains fluorine.

14. A cleaning solution for removing a byproduct derived from a decomposed substance of a process gas containing C and F, and deposited on a component in a process chamber of a semiconductor processing apparatus for subjecting a target substrate to a semiconductor process with the process gas, the cleaning solution comprising N-methyl-2-pyrrolidone, ethylene glycol monobutyl ether, a surfactant, and water; and wherein a total content of the N-methyl-2-pyrrolidone and ethylene glycol monobutyl ether is 80 to 90 wt %, and a ratio of a content of the N-methyl-2-pyrrolidone to the total content of the N-methyl-2-pyrrolidone and ethylene glycol monobutyl ether is 0.75 to 0.95.

15. The cleaning solution according to claim 14, wherein the water concentration is 5 to 20 wt %.

16. The cleaning solution according to claim 14, wherein the surfactant concentration is 0.1 to 1.0 wt %.

17. The cleaning solution according to claim 14, wherein the solution contains 10 ppb or less of an alkali metal.

* * * * *